(12) United States Patent
Morikazu et al.

(10) Patent No.: US 11,597,040 B2
(45) Date of Patent: Mar. 7, 2023

(54) LASER PROCESSING APPARATUS

(71) Applicant: DISCO CORPORATION, Tokyo (JP)

(72) Inventors: Hiroshi Morikazu, Tokyo (JP); Noboru Takeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 632 days.

(21) Appl. No.: 15/919,977

(22) Filed: Mar. 13, 2018

(65) Prior Publication Data

US 2018/0257171 A1    Sep. 13, 2018

(30) Foreign Application Priority Data

Mar. 13, 2017  (JP) .............................. JP2017-047591

(51) Int. Cl.

| | | |
|---|---|---|
| *H01L 21/683* | (2006.01) | |
| *H01L 21/268* | (2006.01) | |
| *B23K 26/53* | (2014.01) | |
| *B23K 26/0622* | (2014.01) | |
| *B23K 26/06* | (2014.01) | |
| *B23K 26/08* | (2014.01) | |

(Continued)

(52) U.S. Cl.

CPC .......... *B23K 26/53* (2015.10); *B23K 26/0622* (2015.10); *B23K 26/0624* (2015.10); *B23K 26/0665* (2013.01); *B23K 26/0853* (2013.01); *H01L 21/268* (2013.01); *H01L 21/67115* (2013.01); *H01L 21/681* (2013.01); *H01L 21/6838* (2013.01); *B23K 2101/40* (2018.08); *H01L 21/67092* (2013.01); *H01L 21/78* (2013.01)

(58) Field of Classification Search

CPC ............... B23K 26/53; B23K 26/0665; B23K 26/0622; H01L 21/268

See application file for complete search history.

(56) References Cited

U.S. PATENT DOCUMENTS

| | | | |
|---|---|---|---|
| 6,970,414 B1 * | 11/2005 | Pavel .................... | B82Y 10/00 369/100 |
| 2007/0215575 A1 * | 9/2007 | Gu ..................... | B23K 26/0624 216/59 |

(Continued)

FOREIGN PATENT DOCUMENTS

| | | |
|---|---|---|
| JP | 10305420 A | 11/1998 |
| JP | 2002192370 A | 7/2002 |

(Continued)

*Primary Examiner* — Erin E McGrath
*Assistant Examiner* — Ahmad Abdel-Rahman
(74) *Attorney, Agent, or Firm* — Greer, Burns & Crain, Ltd.

(57) ABSTRACT

A laser beam irradiation unit of a laser processing apparatus includes: a laser oscillator in which a repetition frequency is set so as to oscillate a pulsed laser having a pulse width shorter than a time of electronic excitation caused by irradiating the workpiece with a laser beam and oscillate at least two pulsed lasers within the electronic excitation time; a condenser that irradiates the workpiece held on the chuck table with the pulsed laser beams oscillated by the laser oscillator; and a thinning-out unit that is disposed between the laser oscillator and the condenser and guides the pulsed laser beams necessary for processing to the condenser by thinning out and discarding pulsed laser beams in a predetermined cycle.

4 Claims, 3 Drawing Sheets

(51) Int. Cl.
    *H01L 21/67*     (2006.01)
    *H01L 21/68*     (2006.01)
    *B23K 101/40*     (2006.01)
    *H01L 21/78*     (2006.01)

(56) References Cited

U.S. PATENT DOCUMENTS

2015/0246848 A1* 9/2015 Ikenoue ................ H01S 3/2232
    65/112
2016/0139488 A1* 5/2016 Nomaru ............... B23K 26/064
    359/305

FOREIGN PATENT DOCUMENTS

JP      2013012534 A * 1/2013
JP      2014221483 A    11/2014

* cited by examiner

LASER PROCESSING APPARATUS

BACKGROUND OF THE INVENTION

Field of the Invention

The present invention relates to a laser processing apparatus that improves processing quality.

Description of the Related Art

A wafer having a plurality of devices such as integrated circuits (ICs), large-scale integrations (LSIs), or the like partitioned by a plurality of intersecting planned dividing lines and formed on a top surface of the wafer is divided into individual device chips by a laser processing apparatus, and each of the divided device chips is used in an electric apparatus such as a mobile telephone, a personal computer, or the like.

There are laser processing apparatuses of the following types (1) to (3), and an appropriate laser processing apparatus is selected in consideration of a kind of workpiece and processing conditions.

(1) A type in which a workpiece is subjected to ablation processing by irradiating the workpiece with a pulsed laser beam of a wavelength absorbable by the workpiece, grooves are thereby formed in planned dividing lines, and the workpiece is divided into individual device chips (see, for example, Japanese Patent Laid-Open No. 1998-305420).

(2) A type in which a modified layer is formed inside planned dividing lines by irradiating a wafer with a pulsed laser beam of a wavelength capable of passing through the workpiece while a focusing point of the pulsed laser beam is positioned inside the planned dividing lines, and then the wafer is divided into individual device chips by applying an external force to the wafer (see, for example, Japanese Patent No. 3408805).

(3) A type in which a plurality of thin holes extending from top surfaces of planned dividing lines to undersurfaces and an amorphous substance surrounding each thin hole are formed by irradiating a wafer with a pulsed laser beam of a wavelength capable of passing through the workpiece while a focusing region of the pulsed laser beam is positioned in the inside of the wafer, the inside corresponding to a planned dividing line, and the wafer is divided into individual device chips (see, for example, Japanese Patent Laid-Open No. 2014-221483).

SUMMARY OF THE INVENTION

The quality of laser processing depends on various processing elements including a feed speed of a workpiece in addition to the output power of a laser beam oscillated by a laser oscillator, a repetition frequency, a pulse width, and a spot diameter, and processing conditions are set by adjusting the various processing elements as appropriate. However, for a further improvement in quality of laser processing, there is a limit to conventional adjustment of the above-described processing elements.

It is accordingly an object of the present invention to provide a laser processing apparatus that achieves a further improvement in quality of laser processing.

In accordance with an aspect of the present invention, there is provided a laser processing apparatus including: a chuck table configured to hold a workpiece; and laser beam irradiating means for irradiating the workpiece held on the chuck table with a pulsed laser beam; the laser beam irradiating means including a laser oscillator in which a repetition frequency is set so as to oscillate a pulsed laser having a pulse width shorter than a time of electronic excitation caused by irradiating the workpiece with a pulsed laser beam and oscillate at least two pulsed lasers within the electronic excitation time, a condenser that irradiates the workpiece held on the chuck table with the pulsed laser beams oscillated by the laser oscillator, thinning-out means for guiding the pulsed laser beams necessary for processing to the condenser by thinning out and discarding pulsed laser beams in a predetermined cycle, the thinning-out means being disposed between the laser oscillator and the condenser, and an amplifier that is disposed between the thinning-out means and the condenser and increases output power of the pulsed laser beams necessary for processing.

Preferably, the thinning-out means thins out the pulsed laser beams such that a time from application of at least two pulsed laser beams to application of at least two subsequent pulsed laser beams is equal to or more than a time taken for heat generated in the workpiece to be released after the application of the at least two previous pulsed laser beams.

According to the laser processing apparatus in accordance with the present invention, in a state in which electrons surrounding atoms constituting the workpiece are activated by a first pulsed laser beam, a subsequent pulsed laser beam is applied. Thus, the processing is promoted, so that the quality of the laser processing is improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
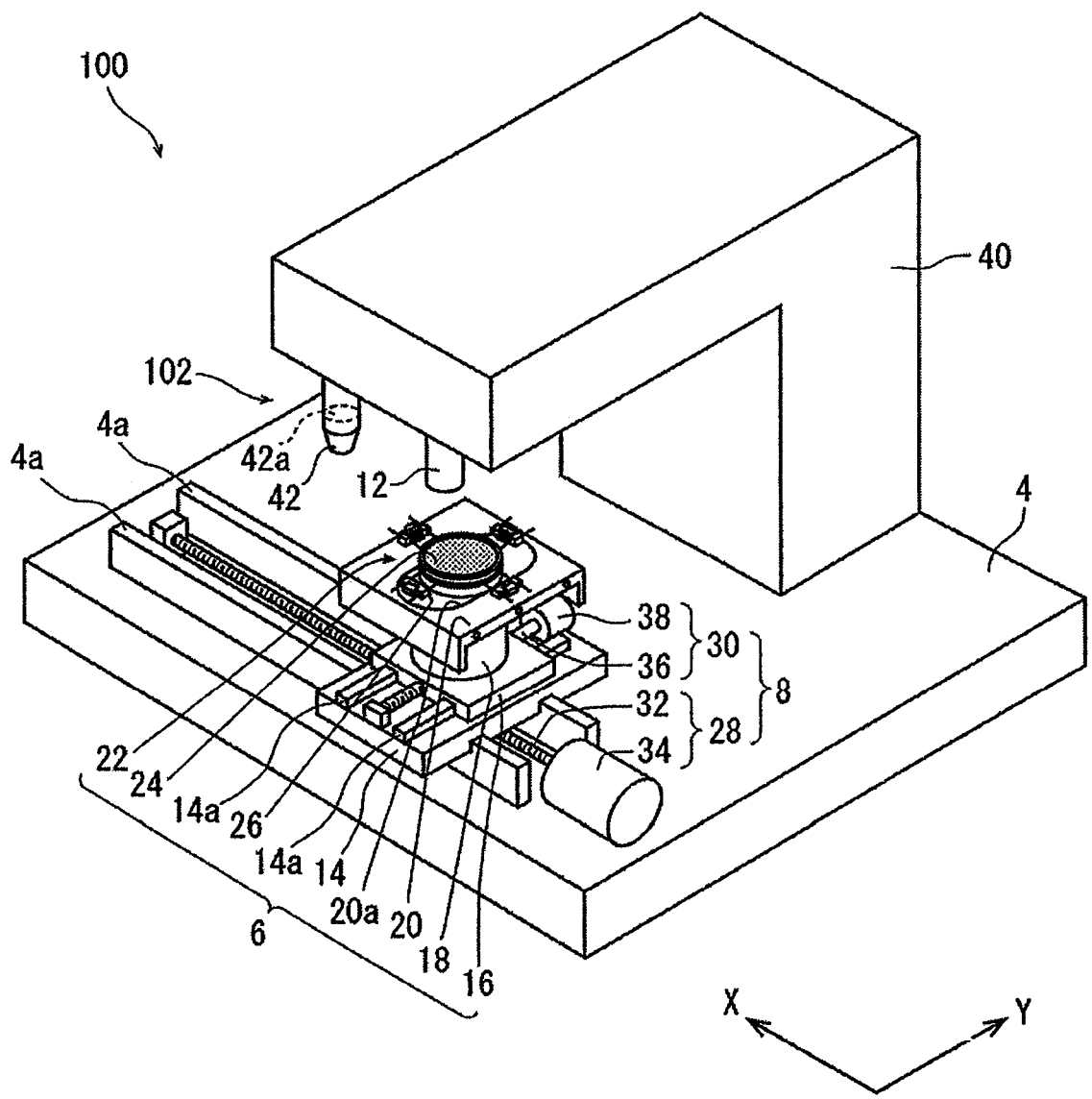
FIG. 1 is a perspective view of a laser processing apparatus according to an embodiment of the present invention.

An embodiment of a laser processing apparatus configured according to the present invention will hereinafter be described with reference to the drawings. A laser processing apparatus 100 depicted in FIG. 1 includes: a base 4; holding means 6 for holding a workpiece; moving means 8 for moving the holding means 6; laser beam irradiating means 102 for irradiating the workpiece held by the holding means 6 with a pulsed laser beam; and imaging means 12 for imaging the workpiece held by the holding means 6.

As depicted in FIG. 1, the holding means 6 includes: a rectangular X-direction movable plate 14 mounted on the base 4 movably in an X-direction; a rectangular Y-direction movable plate 16 mounted on the X-direction movable plate 14 movably in a Y-direction; a cylindrical column 18 fixed to an upper surface of the Y-direction movable plate 16; and a rectangular cover plate 20 fixed to an upper end of the column 18. An elongated hole 20a extending in the Y-direction is formed in the cover plate 20. A circular chuck table 22 extending upward through the elongated hole 20a is rotatably mounted on the upper end of the column 18. A circular suction chuck 24 that is formed of a porous material and extends substantially horizontally is disposed on an upper surface of the chuck table 22. The suction chuck 24 is connected to suction means (not depicted) by a flow passage. The chuck table 22 can suck and hold the workpiece mounted on an upper surface of the suction chuck 24 by generating a suction force in the upper surface of the suction chuck 24 by the suction means. In addition, a plurality of clamps 26 are arranged at intervals in a circumferential direction around the periphery of the chuck table 22. Incidentally, the X-direction is a direction indicated by an arrow X in FIG. 1, and the Y-direction is a direction indicated by an arrow Y in FIG. 1 and is a direction orthogonal to the X-direction. A plane defined by the X-direction and the Y-direction is substantially horizontal.

The moving means 8 includes: X-direction moving means 28 for moving the chuck table 22 in the X-direction; Y-direction moving means 30 for moving the chuck table 22 in the Y-direction; and rotating means (not depicted) for rotating the chuck table 22 about an axis extending in a vertical direction. The X-direction moving means 28 has a ball screw 32 extending in the X-direction on the base 4 and a motor 34 coupled to one end portion of the ball screw 32. A nut portion (not depicted) of the ball screw 32 is fixed to a lower surface of the X-direction movable plate 14. The X-direction moving means 28 converts a rotary motion of the motor 34 into a rectilinear motion by the ball screw 32, and transmits the rectilinear motion to the X-direction movable plate 14 to advance or retreat the X-direction movable plate 14 in the X-direction along guide rails 4a on the base 4. The chuck table 22 is thereby advanced or retreated in the X-direction. The Y-direction moving means 30 has a ball screw 36 extending in the Y-direction on the X-direction movable plate 14 and a motor 38 coupled to one end portion of the ball screw 36. A nut portion (not depicted) of the ball screw 36 is fixed to a lower surface of the Y-direction movable plate 16. The Y-direction moving means 30 converts a rotary motion of the motor 38 into a rectilinear motion by the ball screw 36, and transmits the rectilinear motion to the Y-direction movable plate 16 to advance or retreat the Y-direction movable plate 16 in the Y-direction along guide rails 14a on the X-direction movable plate 14. The chuck table 22 is thereby advanced or retreated in the Y-direction. The rotating means has a motor (not depicted) included in the column 18, and rotates the chuck table 22 with respect to the column 18 about an axis extending in the vertical direction.

The laser beam irradiating means (laser beam irradiation unit) 102 includes: a frame body 40 extending upward from an upper surface of the base 4 and then extending substantially horizontally; a condenser 42 disposed on an undersurface of an end of the frame body 40; and focusing point position adjusting means (not depicted). The condenser 42 includes a condensing lens 42a for condensing and applying a laser beam to the workpiece held on the chuck table 22 of the holding means 6. In addition, the imaging means (imaging unit) 12 is attached to the undersurface of the end of the frame body 40 at an interval in the X-direction from the condenser 42.

Making description with reference to FIG. 2, the laser beam irradiating means 102 includes: a laser oscillator 104 in which a repetition frequency is set so as to oscillate pulsed laser beams LB' having a pulse width shorter than a time of electronic excitation caused by irradiating the workpiece such as a wafer or the like with a laser beam (which time will hereinafter be referred to as an "electronic excitation time") and oscillate at least two pulsed laser beams LB' within the electronic excitation time; thinning-out means 106 for guiding the pulsed laser beams LB' necessary for processing to the condensing lens 42a of the condenser 42 by thinning out and discarding pulsed laser beams LB' in a predetermined cycle, the thinning-out means 106 being disposed between the laser oscillator 104 and the condensing lens 42a of the condenser 42; an amplifier 108 that is disposed between the thinning-out means 106 and the condensing lens 42a of the condenser 42, and increases output power of the pulsed laser beams LB' necessary for processing; and a mirror 110 that changes an optical path of the pulsed laser beams LB' amplified by the amplifier 108 and guides the pulsed laser beams LB' to the condensing lens 42a of the condenser 42.

The pulse width of the pulsed laser beams LB' oscillated by the laser oscillator 104 is shorter than the electronic excitation time, and is preferably set to approximately 1 picosecond in a case where sapphire ($Al_2O_3$) whose electronic excitation time is approximately 8 picoseconds ($8 \times 10^{-12}$ seconds) is the workpiece, for example. The wavelength of the pulsed laser beams LB' oscillated by the laser oscillator 104 is 355 nm, 1064 nm, or the like, and is determined as appropriate according to a kind of processing. In addition, the repetition frequency of the pulsed laser beams LB' oscillated by the laser oscillator 104 is set such that at least two pulsed laser beams LB' are oscillated within the electronic excitation time, and is favorably set to 250 GHz ($250 \times 10^9$ Hz) in the case where sapphire whose electronic excitation time is approximately 8 picoseconds is the workpiece, for example. Consequently, the oscillation intervals of the pulsed laser beams LB' are 4 picoseconds, and the laser oscillator 104 can oscillate at least two pulsed laser beams LB' within the electronic excitation time of sapphire. Thus, in the laser oscillator 104, the repetition frequency is set such that pulsed laser beams LB' having a pulse width shorter than the electronic excitation time are oscillated and at least two pulsed laser beams LB' are oscillated within the electronic excitation time. Therefore, within the time of electronic excitation caused by irradiating the workpiece with a first pulsed laser beam LB1', the laser beam irradiating means 102 can irradiate the workpiece with a next second pulsed laser beam LB2'.

Figure 2:
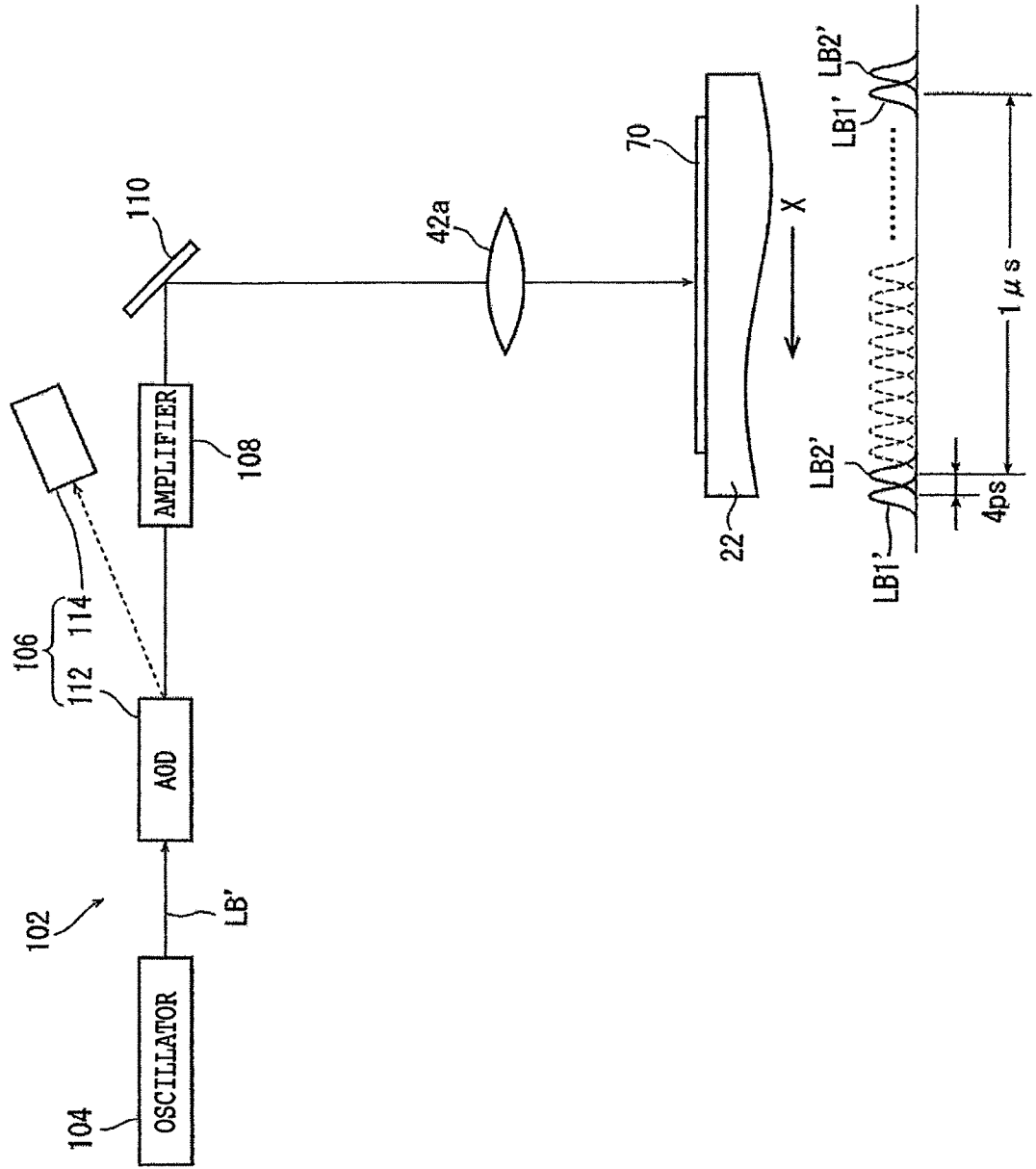
FIG. 2 is a block diagram of laser beam irradiating means depicted in FIG. 1.

In the present embodiment, as depicted in FIG. 2, the thinning-out means 106 is constituted of an AOD (acoustooptic element) 112 that changes an optical path according to a voltage signal applied thereto and a damper 114 that absorbs the pulsed laser beams LB' whose optical path is changed. The AOD 112 guides the pulsed laser beams LB' oscillated by the laser oscillator 104 to the amplifier 108 when the voltage signal is not applied to the AOD 112, and guides the pulsed laser beams LB' oscillated by the laser oscillator 104 to the damper 114 when a predetermined voltage signal is applied to the AOD 112. The thinning-out means 106 preferably thins out the pulsed laser beams LB' such that a time from irradiation of the workpiece with at least two pulsed laser beams LB' to irradiation of the workpiece with at least two subsequent pulsed laser beams LB' is equal to or more than a time taken for heat generated in the workpiece to be released after the irradiation of the workpiece with the at least two previous pulsed laser beams LB'. Consequently, a heat effect of laser processing is inhibited from being produced on the workpiece, so that quality of laser processing is improved.

In a case where sapphire, in which the time taken for heat generated in the workpiece to be released by irradiation with a laser beam (which time will hereinafter be referred to as a "heat releasing time") is approximately 1 microsecond ($1 \times 10^{-6}$ seconds), is the workpiece, for example, as depicted in FIG. 2, the thinning-out means 106 preferably thins out pulsed laser beams LB' such that a time from irradiation of the workpiece with a first pulsed laser beam LB1' and a second pulsed laser beam LB2' to irradiation of the workpiece with a subsequent first pulsed laser beam LB1' and a subsequent second pulsed laser beam LB2' is equal to or more than the heat releasing time (approximately 1 microsecond) of sapphire. FIG. 2 depicts pulsed laser beams LB' removed by the thinning-out means 106 by dotted lines. In addition, in the present embodiment, where most of the pulsed laser beams LB' oscillated by the laser oscillator 104 are removed by the thinning-out means 106, the amplifier 108 that increases the output power of the pulsed laser beams LB' is disposed between the thinning-out means 106 and the condensing lens 42a. Therefore, the output power of the pulsed laser beams LB' oscillated by the laser oscillator 104 may be relatively low. Hence, a decrease in energy efficiency is suppressed.

Figure 3:
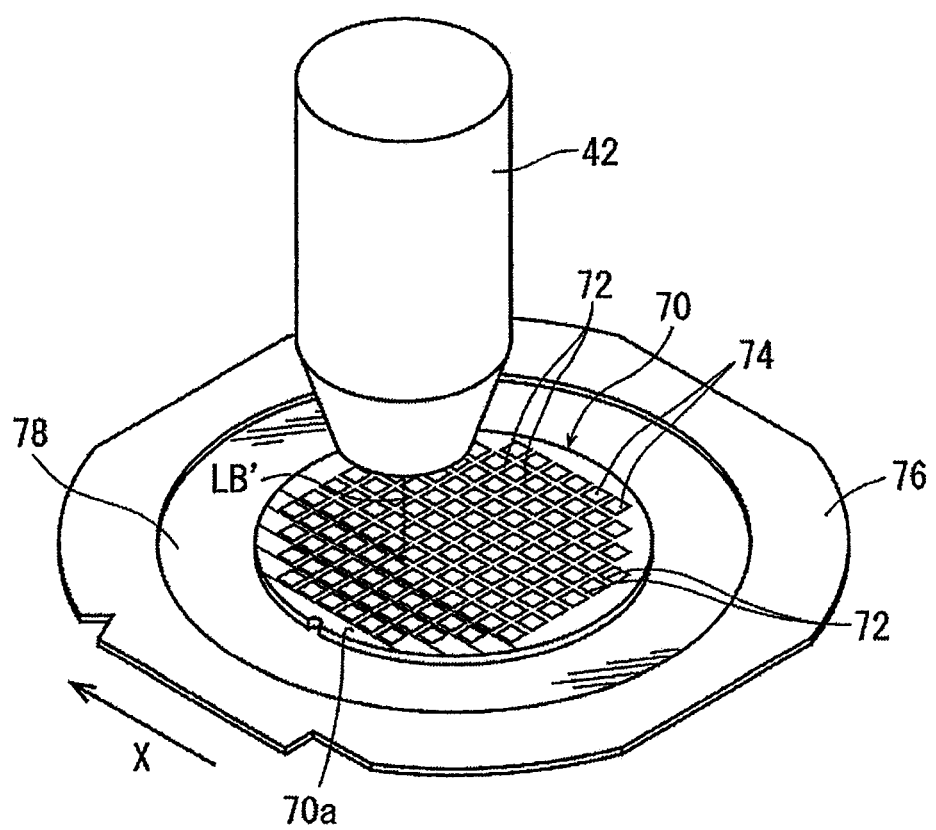
FIG. 3 is a perspective view of a state in which a wafer is irradiated with a laser beam.

A top surface 70a of a disk-shaped wafer 70 depicted in FIG. 3 is partitioned into a plurality of rectangular regions by a plurality of planned dividing lines 72 formed in a lattice manner. A device 74 such as an IC, an LSI, or the like is formed in each of the plurality of rectangular regions. In the present embodiment, an undersurface of the wafer 70 is affixed to an adhesive tape 78 whose peripheral edge is fixed to an annular frame 76. Incidentally, the top surface 70a of the wafer 70 may be affixed to the adhesive tape 78.

When the wafer 70 is subjected to laser processing using the laser processing apparatus 100, a wafer holding step is first performed which holds the wafer 70 on the upper surface of the chuck table 22 with the top surface 70a of the wafer 70 facing upward, and fixes an outer peripheral edge portion of the annular frame 76 by the plurality of clamps 26. Next, an alignment step is performed which images the wafer 70 from above by the imaging means 12, and aligns the planned dividing lines 72 in the form of a lattice in the X-direction and the Y-direction by moving and rotating the chuck table 22 by the moving means 8 on the basis of an image of the wafer 70 imaged by the imaging means 12. Then, a focusing point position adjusting step is performed which positions the condenser 42 above one end portion of a planned dividing line 72 aligned in the X-direction, and adjusts a vertical position of a focusing point by raising or lowering the condenser 42 by the focusing point position adjusting means. Incidentally, the diameter of the focusing point is φ1 to 20 μm or the like, and is determined as appropriate according to a kind of processing.

Subsequently, a first irradiating step is performed which applies a first pulsed laser beam LB1' having a pulse width shorter than the time of electronic excitation caused by irradiating the wafer 70 with a laser beam, and a second irradiating step is performed which applies a subsequent second pulsed laser beam LB2' within the electronic excitation time of the wafer 70. As described above, in the laser processing apparatus 100, the pulse width of the pulsed laser beams LB' oscillated by the laser oscillator 104 is set shorter than the electronic excitation time of the workpiece, and the workpiece can be irradiated with the subsequent second pulsed laser beam LB2' within the time of electronic excitation caused by irradiating the workpiece with the first pulsed laser beam LB1'. It is therefore possible to perform the first irradiating step and the second irradiating step by using the laser processing apparatus 100. When the first irradiating step and the second irradiating step are performed, the subsequent second pulsed laser beam LB2' is applied in a state in which electrons surrounding atoms constituting the wafer 70 are activated by the first pulsed laser beam LB1'. Thus, the processing is promoted, so that quality of the laser processing is improved.

For example, in a case where modified layer formation processing is performed which forms a modified layer inside the planned dividing lines 72 by applying a laser beam capable of passing through the wafer 70, a modified layer relative long inside the planned dividing lines 72 in a direction of incidence of the laser beam can be formed by performing the first irradiating step and the second irradiating step. After the first irradiating step and the second irradiating step are first performed, division processing is performed along the planned dividing lines 72, which division processing alternately repeats the first irradiating step and the second irradiating step while performing processing feeding of the chuck table 22 in the X-direction by the X-direction moving means 28 at a predetermined processing feed speed (that may be 500 mm/second, for example, but is determined as appropriate in consideration of the repetition frequency) with respect to the focusing point, as depicted in FIG. 3. The division processing is performed for all of the planned dividing lines 72 aligned in the X-direction while the Y-direction moving means 30 performs index feeding of the chuck table 22 in the Y-direction with respect to the focusing point by amounts corresponding to intervals between the planned dividing lines 72. In addition, the chuck table 22 is rotated by 90 degrees by the rotating means, and then division processing is performed while index feeding is performed. The division processing is thereby performed also for all of the planned dividing lines 72 orthogonal to the planned dividing lines 72 to which the division processing has been performed first. Thus, the wafer 70 can be divided into individual device chips having a device 74 by the laser processing whose processing quality is improved.

When the division processing is performed, the thinning-out means 106 conveniently thins out pulsed laser beams LB' such that a time from irradiation of the wafer 70 with a first pulsed laser beam LB1' and a second pulsed laser beam LB2' to irradiation of the wafer 70 with a subsequent first pulsed laser beam LB1' and a subsequent second pulsed laser beam LB2' is equal to or more than a time taken for heat generated in the wafer 70 to be released after the irradiation of the wafer 70 with the previous first pulsed laser beam LB1' and the previous second pulsed laser beam LB2'. Consequently, a heat effect of the laser processing is inhibited from being produced on the wafer 70, so that quality of the laser processing is improved.

Incidentally, the electronic excitation time and the heat releasing time differ depending on the workpiece. The electronic excitation times and the heat releasing times of, for example, sapphire ($Al_2O_3$), silicon (Si), lithium tantalate ($LiTaO_3$), lithium niobate ($LiNbO_3$), and copper (Cu), are as follows.

| Workpiece | Electronic Excitation Time | Heat Releasing Time |
| --- | --- | --- |
| sapphire | 8 ps | 1 μs |
| silicon | 20 ps | 5 μs |
| lithium tantalate | 50 ps | 50 μs |
| lithium niobate | 50 ps | 50 μs |
| copper | 20 ps | 5 μs |

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table configured to hold a workpiece; and
laser beam irradiating means for irradiating the workpiece held on the chuck table with a pulsed laser beam;
the laser beam irradiating means including
a laser oscillator in which a repetition frequency is set so as to oscillate a pulsed laser having a pulse width shorter than a time of electronic excitation caused by irradiating the workpiece with a pulsed laser beam and oscillate at least two pulsed laser beams within the electronic excitation time, wherein the at least two pulsed laser beams are temporally spaced from each other,
a condenser that irradiates the workpiece held on the chuck table with the at least two pulsed laser beams oscillated by the laser oscillator,
thinning-out means for guiding the pulsed laser beams necessary for processing to the condenser while simultaneously thinning out and discarding pulsed laser beams in a predetermined cycle, the thinning-out means being disposed between the laser oscillator and the condenser, the thinning out means including an acoustooptic element and a damper, said acoustooptic element being in direct communication with said damper, wherein said acoustoooptic element changes an optical path of the pulsed laser beams to guide the pulsed laser beams to said damper and the pulsed laser beams necessary for processing to the condenser, wherein the thinning-out means thins out the pulsed laser beams such that a time from application of a first pulsed laser beam of said at least two pulsed laser beams to application of a second pulsed laser beam of said at least two subsequent pulsed laser beams is equal to or more than a time taken for heat generated in the workpiece to be released after the application of the at least two previous pulsed laser beams, and
an amplifier disposed between the thinning-out means and the condenser, said amplifier configured to increase output power of the at least two pulsed laser beams necessary for processing that are outputted from the thinning out means and directed to the condenser.

2. The laser processing apparatus according to claim 1, wherein said acoustooptic element guides said at least two of the pulsed laser beams necessary for processing to the amplifier when a voltage signal is not applied to said acoustooptic element, and wherein said acoustooptic element guides the pulsed laser beams to the damper when a voltage signal is applied to said acoustooptic element.

3. The laser processing apparatus according to claim 1, wherein the workpiece comprises one of sapphire, silicon, lithium tantalate, lithium niobite and copper.

4. The laser processing apparatus according to claim 1, further comprising a mirror positioned between the amplifier and the condenser, wherein the mirror changes the optical path of the pulsed laser beams necessary for processing amplified by the amplifier and guides the pulsed laser beams necessary for processing to the condenser.

* * * * *